United States Patent
Bostanjoglo et al.

(10) Patent No.: US 7,455,740 B2
(45) Date of Patent: Nov. 25, 2008

(54) METHOD FOR PRODUCING A THREE-DIMENSIONAL MOULDED BODY

(75) Inventors: Georg Bostanjoglo, Berlin (DE); Nigel-Philip Cox, Mülheim an der Ruhr (DE); Rolf Wilkenhöner, Kleinmachnow (DE)

(73) Assignee: Siemens Aktiengesellschaft, Munich (DE)

( * ) Notice: Subject to any disclaimer, the term of this patent is extended or adjusted under 35 U.S.C. 154(b) by 418 days.

(21) Appl. No.: 10/527,429

(22) PCT Filed: Aug. 20, 2003

(86) PCT No.: PCT/EP03/09236

§ 371 (c)(1),
(2), (4) Date: Mar. 10, 2005

(87) PCT Pub. No.: WO2004/028786

PCT Pub. Date: Apr. 8, 2004

(65) Prior Publication Data

US 2005/0268998 A1    Dec. 8, 2005

(30) Foreign Application Priority Data

Sep. 17, 2002   (EP) .................... 02020817

(51) Int. Cl.
*B22F 7/06* (2006.01)

(52) U.S. Cl. ..................... 148/525; 148/565

(58) Field of Classification Search ............... 148/525, 148/565
See application file for complete search history.

(56) References Cited

U.S. PATENT DOCUMENTS

| 3,939,895 A | | 2/1976 | Sawyer |
| 4,036,599 A | | 7/1977 | Dhingra |
| 4,085,415 A | | 4/1978 | Ikechi |
| 4,543,235 A | | 9/1985 | Lemkey et al. |
| 5,156,697 A | * | 10/1992 | Bourell et al. ............ 264/497 |
| 6,024,792 A | * | 2/2000 | Kurz et al. .................. 117/9 |
| 6,350,326 B1 | * | 2/2002 | McCay et al. ............ 148/503 |
| 6,355,086 B2 | | 3/2002 | Brown et al. |

FOREIGN PATENT DOCUMENTS

| DE | 199 03 436 A1 | 8/2000 |
| DE | 100 24 343 A1 | 11/2001 |
| EP | 0 799 904 A1 | 10/1997 |
| EP | 0 892 090 A1 | 1/1999 |
| WO | WO 92/10343 | 6/1992 |
| WO | WO 01/45882 A2 | 6/2001 |

* cited by examiner

*Primary Examiner*—George Wyszomierski

(57) ABSTRACT

Methods according to prior art for producing three-dimensional molded bodies generally require outer molds which define the geometry of a component to be produced. The inventive method for producing three-dimensional molded bodies renders one such mold redundant. The geometry of a component to be produced is defined by a pre-determined laser guidance or by the geometry of the partial quantities used.

6 Claims, 4 Drawing Sheets

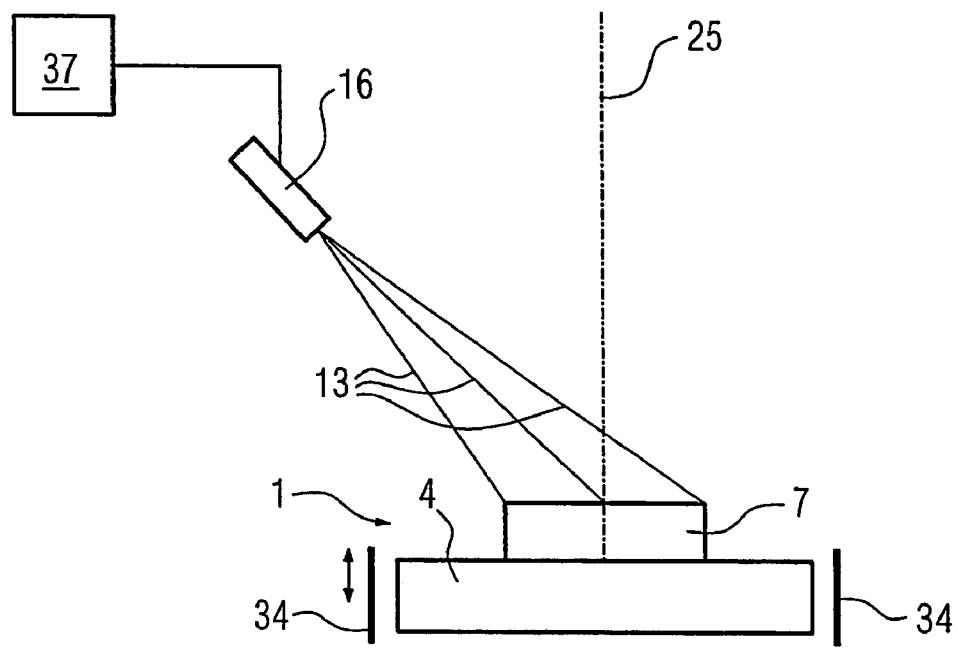
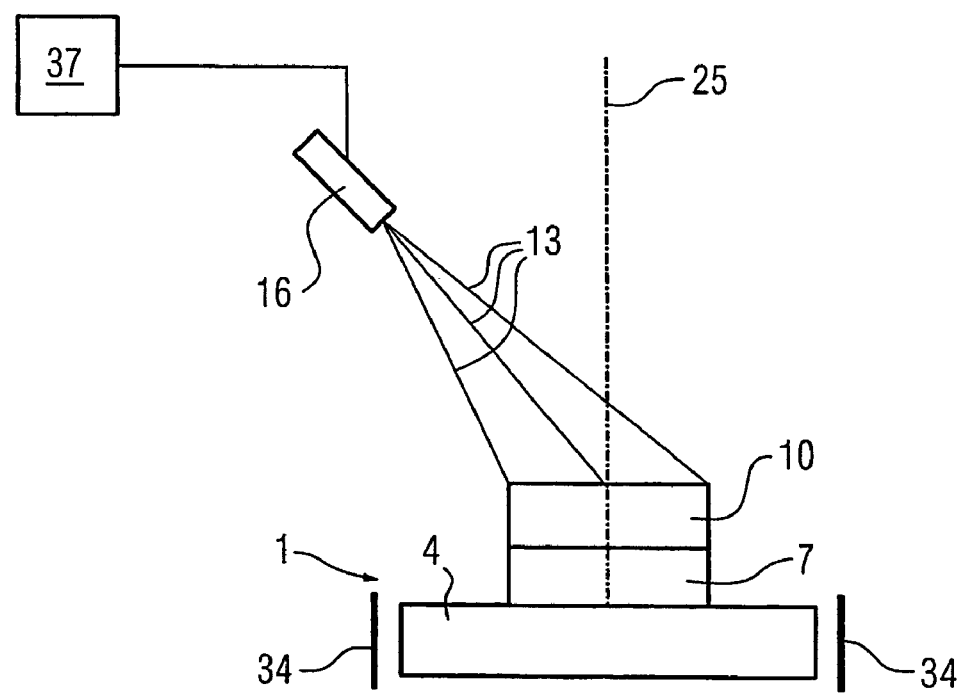

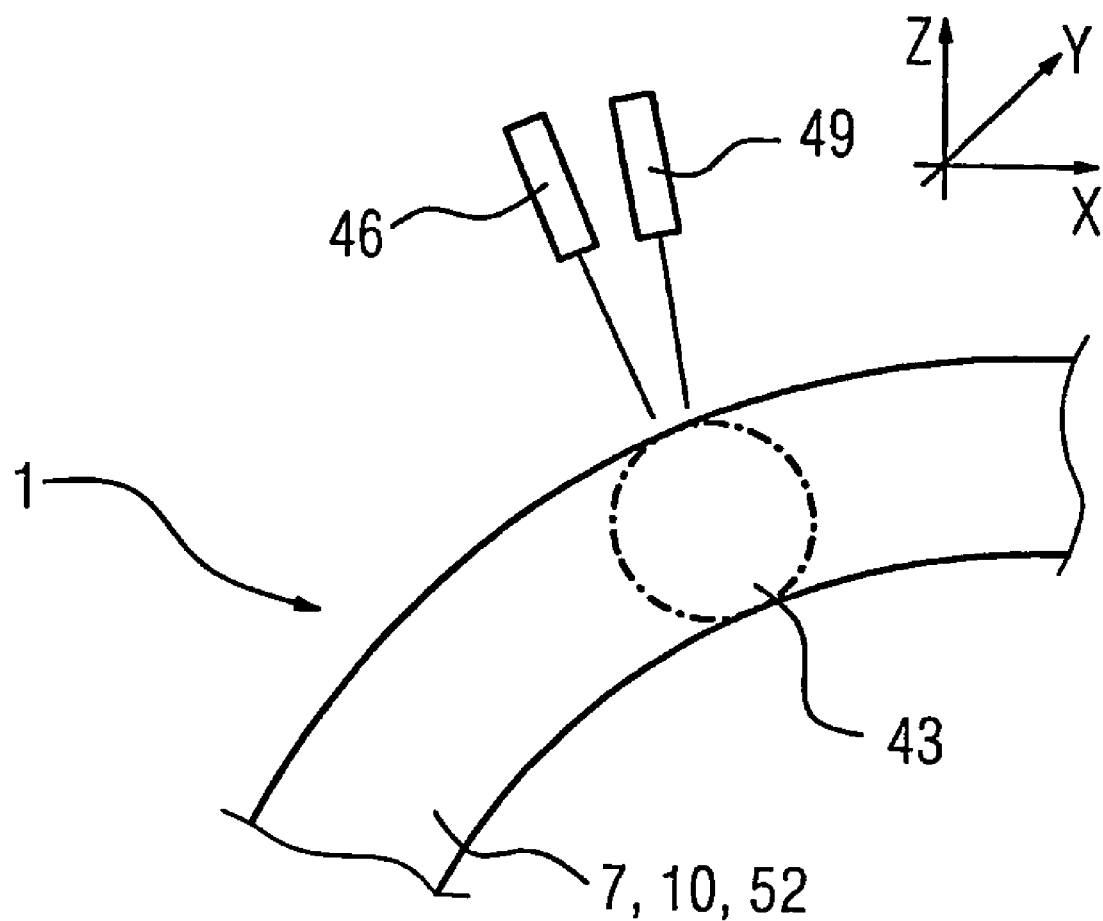

METHOD FOR PRODUCING A THREE-DIMENSIONAL MOULDED BODY

CROSS REFERENCE TO RELATED APPLICATION

This application is the US National Stage of International Application No. PCT/EP2003/009236, filed Aug. 20, 2003 and claims the benefit thereof. The International Application claims the benefits of European Patent application No. 02020817.9 EP filed Sep. 17, 2002, both of the applications are incorporated by reference herein in their entirety.

FIELD OF THE INVENTION

The invention relates to method for producing a three-dimensional molded body.

BACKGROUND OF THE INVENTION

DE 199 03 436 C2 discloses a method for producing three-dimensional bodies in which, firstly, an enveloping body is built up and, subsequently, it is filled at least partly with a second material. The enveloping body is an essential prerequisite for the method.

EP 892 090 A1 shows a method for repairing a three-dimensional body in which a layer is applied only in the superficial region.

U.S. Pat. Nos. 4,085,415, 3,939,895, 4,543,235 and 4,036,599 show methods for introducing fibers into cast components.

Casting shells are required for the casting.

DE 100 24 343 A1 and EP 0 799 904 B1 show methods for producing gradients in a metallic or ceramic microstructure.

SUMMARY OF THE INVENTION

It is therefore the object of the invention to present a method in which a three-dimensional molded body can be produced in a simple way.

The object is achieved by a method according to the claims. In this case, various consistencies of at least two partial quantities in the form of layers of at least one starting material are bonded to form a three-dimensional molded body.

Advantageous developments of the invention emerge from the subclaims.

BRIEF DESCRIPTION OF THE DRAWINGS

In the drawings:

FIG. 1 shows an apparatus given by way of example, with which the method according to the invention is carried out, FIG. 2 shows a further method step of the method according to the invention, FIG. 7 shows a further apparatus given by way of example, with which the method according to the invention is carried out.

DETAILED DESCRIPTION OF THE INVENTION

Figure 3:
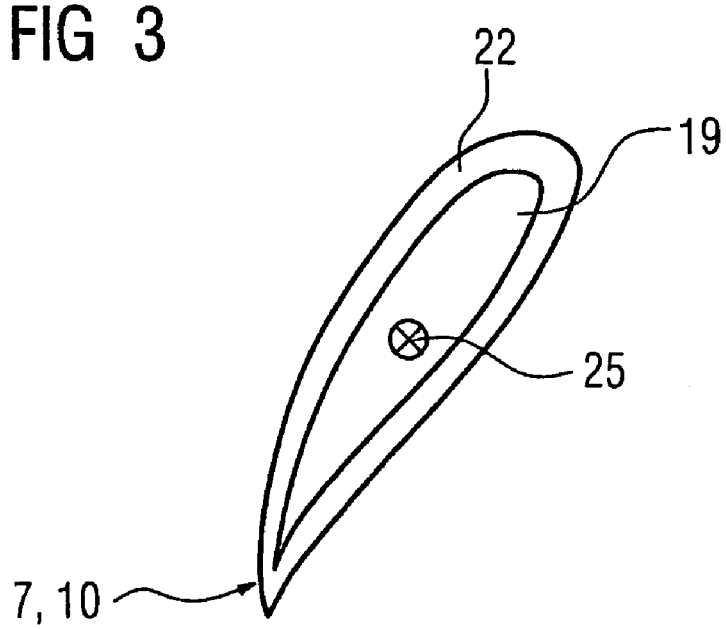
FIG. 3 shows a cross section of a partial quantity which is processed by means of the method according to the invention and FIG. 4 shows a further cross section of a partial quantity.

FIG. 1 shows an apparatus 1 given by way of example for carrying out the method according to the invention.

Arranged inside an optionally provided heater 34 is for example a starting plate 4, on which a first partial quantity 7 in the form of a layer of at least a first starting material lies.

The partial quantity 7 can be displaced with respect to the heater 34 in a building-up direction 25 of the three-dimensional molded body, or the heater 34 is displaced with respect to the partial quantity 7 or the molded body to be built up.

A three-dimensional molded body, for example a turbine blade, is produced from the partial quantity 7 in the form of a layer.

The partial quantity 7 is, in terms of consistency, for example a powder compact in the form of a layer, a powder bed 52 to be built up layer by layer (FIG. 6) or a metal sheet or a metal foil (both in the form of a layer).

In the case of metal foils or metal sheets, at least one laser 16 for example cuts out the desired geometry for the three-dimensional molded body to be produced, unless it is already in this form.

In one of the first method steps, the first partial quantity 7 in the form of a layer is for example compacted. This is necessary in the case of powder compacts and powder beds, but not necessarily in the case of metal sheets or metal foils.

This may take place by known thermal methods of compaction (sintering) or with laser beams 13 or electron beams which originate from the laser 16 and act on the partial quantity 7 (laser sintering).

The laser beams 13 may fully or partially cover the first partial quantity 7 and, if appropriate, even melt the material of the first partial quantity 7.

The laser 16 and/or its laser beams 13 may change their position with respect to the first partial quantity 7 in all spatial directions. In a control unit 37, a CAD model of the three-dimensional molded body is stored, so that the laser 16/laser beams 13 is/are controlled in such a way that the desired three-dimensional molded body is produced with its outer and inner dimensions in accordance with the CAD model from the first partial quantity 7 and further partial quantities 10 (FIG. 2).

The laser 16 may have the effect that the partial quantity 7 is compacted, and, if appropriate, a shaping of the first partial quantity 7 takes place. Shaping does not have to take place, for example if the powder compact corresponds in its form to the corresponding part of the three-dimensional molded body already or after shrinkage following compaction.

As many partial quantities 10 in the form of layers as correspond to the height of the molded body in the building-up direction 25 are required to complete the molded body.

FIG. 2 shows a further method step of the method according to the invention.

A second partial quantity 10 in the form of a layer is arranged on the first partial quantity 7.

The second partial quantity 10 consists for example, but not necessarily, of a second starting material, in order for example to produce a material gradient in the molded body.

The second partial quantity 10 is for example likewise compacted, in particular by exposure to laser beams 13.

If appropriate, the laser 16 also has the effect of shaping the second partial quantity 10.

The thermal treatment, for example the laser treatment, has the effect that the partial quantities 7, 10 in the form of layers are bonded to one another, for example by sintering or fusion.

A further possibility for producing a three-dimensional molded body is that the three-dimensional molded body to be produced from the at least two partial quantities 7, 10 has a directionally solidified structure, i.e. a monocrystalline structure (SX) or grain boundaries (DS) only along one direction (building-up direction 25). This may for example take place by the starting plate 4 having for example a desired crystalline structure of the three-dimensional molded body to be produced. For this method, in a first step (FIG. 1), the first partial quantity 7 is melted and cooled in a controlled manner, creating the desired crystalline structure.

In a second step (FIG. 2), the second partial quantity 10 is placed on and melted, whereby it bonds with the first partial quantity 7. If appropriate, the first partial quantity 7 is slightly melted at the surface.

By suitable guidance, for example of the heater 34, and/or heating by the laser 16, the solidification front with the desired crystalline structure advances from the first partial quantity 7 into the second partial quantity 10.

This method can be repeated as often as desired.

With respect to the growth conditions for producing crystalline structures by means of epitaxial growth, reference is made here to EP 892 090 A1, which is expressly intended to be included as part of this disclosure.

The use of the laser 16, i.e. a corresponding movement of the laser beams over the partial quantities 7, 10, has the effect for example that only the regions of the partial quantities 7, 10 that correspond to the dimensions of the desired three-dimensional molded body to be produced are compacted or melted. The partial quantities 7, 10 therefore do not have to correspond in their dimensions to the desired three-dimensional molded body.

An outer mold or envelope, as is necessary for example when casting, is not necessary here.

The bonding of the partial quantities in the form of layers is repeated as often as it takes to create the molded body.

The molded body is completely created just from individual layers which are for example 0.1 mm to 1 cm thick.

In particular, the molded body is longer perpendicularly to a plane in which the partial quantities 7, 10 in the form of layers extend than the extent of the molded body in this plane, as is the case for example in the case of a turbine blade. Such a turbine blade is produced layer by layer, for example from the blade root to the blade tip.

FIG. 3 shows a cross section of a partial quantity 7, 10 perpendicularly to the building-up direction 25.

The partial quantity 7 is for example a powder compact which in the interior has a cavity 19, which is enclosed by a wall 22. Such hollow components are used in particular as turbine blades (three-dimensional component) which are cooled in the interior 19 and are enclosed by an outer wall 22.

The partial quantity 7, 10 may also be a powder compact which does not have a cavity 19.

By suitable guidance of the laser beams 13, only the regions of the partial quantity 7, 10 that correspond to the wall 22 of the component to be produced (three-dimensional molded body) are compacted or melted and left to solidify. The pressed powder in the middle remains uncompacted and loose and can be easily removed after production of the three-dimensional molded body.

Similarly, metal sheets or foils may be used, given their outer and inner form by the laser 16 and then melted.

Figure 4:
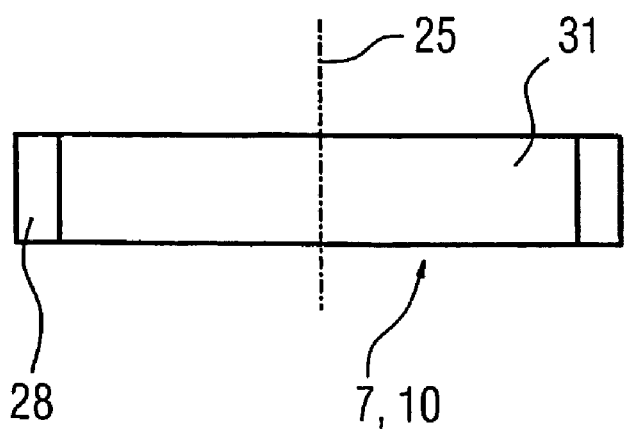

FIG. 4 shows further partial quantities 7, 10.

The partial quantity 7, 10 is for example a powder compact and may have in its composition a gradient or a layer structure in the building-up direction 25 or in the plane perpendicular to the building-up direction 25. The latter is the case in FIG. 4.

In an inner region 31, the partial quantity 7, 10 consists for example of one material, for example a powder for a nickel-based or cobalt-based superalloy. In the outer region, the inner region 31 is enveloped by a layer 28 which has a different material composition than the inner region 31. This is for example a powder for an MCrAlY layer, M standing for an element of the group comprising iron, cobalt or nickel.

When the partial quantities 7, 10, 52 are exposed to the laser beams 13, the parameters of the latter (intensity, wavelength, size, . . . ) are, if appropriate, adapted to the gradient.

Figure 5:
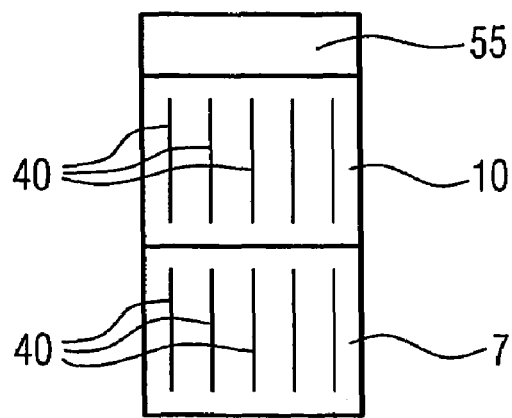
FIG. 5 shows a partial quantity with fibers.

FIG. 5 shows by way of example a first partial quantity 7, a second partial quantity 10, in which fibers 40 are arranged, and a further partial quantity 55.

The fibers 40 may be arranged in a directed manner or randomly. Similarly, fiber mats may be used. The fibers 40 may have been incorporated in the powder compacts 7, 10 or be already present in the metal sheets.

The next partial quantity 55 in the form of a layer may likewise have no fibers, but by no means has to, because for example no mechanical reinforcement is necessary there. The three-dimensional molded body consequently has a material gradient, as also exists in principle in FIG. 4.

Figure 6:
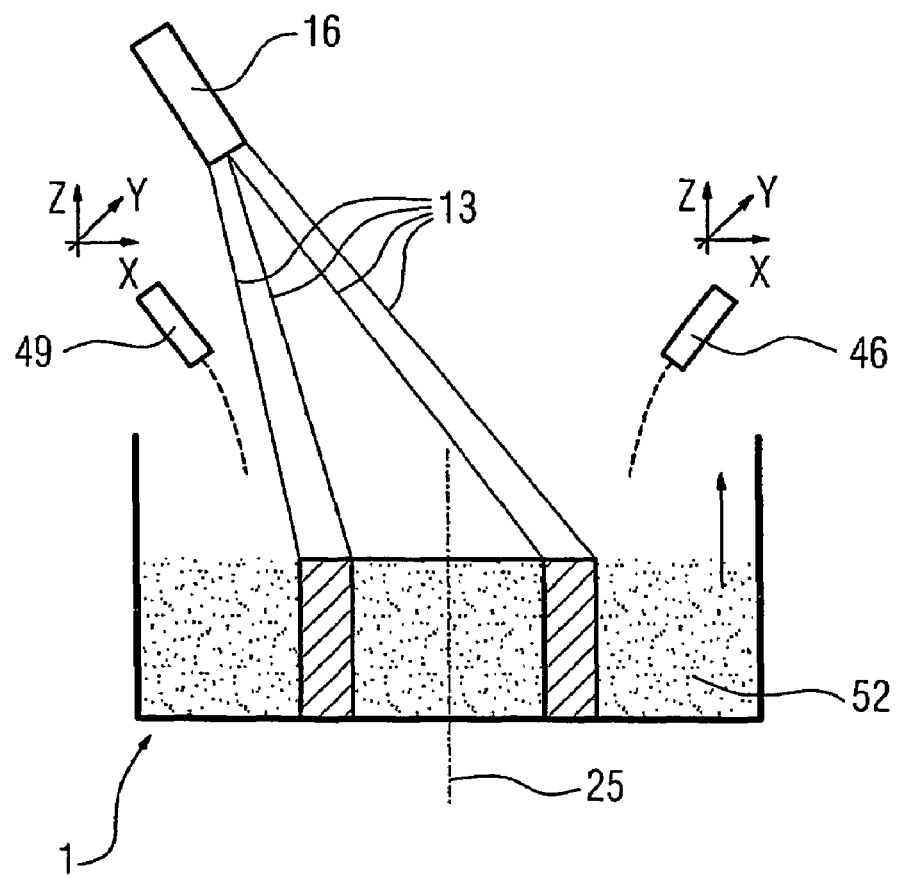
FIG. 6 shows a further apparatus for carrying out the method according to the invention.

FIG. 6 shows a further apparatus 1 for carrying out the method according to the invention.

The laser 16 acts with its laser beams 13 on a powder bed 52, which represents a further consistency of the at least one starting material.

The method is started with a specific quantity of powder of a first starting material, which represents the powder bed 52 (first partial quantity 7).

Further material in the form of powder (second partial quantity 10) is added continuously or discontinuously to the powder bed 52 by means of a first and/or also a second material supply 46, 49, so that the powder bed 52 increases layer by layer in the building-up direction 25.

The composition of the material supplied may change by adding a second starting material to the first starting material, in order to obtain a uniform distribution of a second phase (the material supply for the second starting material is constant in terms of time and location, with respect to the powder bed 52) or in order to create a material gradient in the partial quantity (the material supply for the second starting material differs in terms of location, with respect to the powder bed 52, and, if appropriate, in terms of time).

The material supplies 46, 49 may be moved locationally in all directions (x, y, z).

The first material supply 46 supplies for example a matrix material and the second material supply 49 may supply for example fibers, second phases or other constituents.

With the laser beams 13, only the regions of the powder bed 52 that are predetermined in a predetermined CAD model are compacted.

After the completion of the three-dimensional molded body, the compacted material is removed from the loose powder bed 52.

Fibers 40 or other second phases may also be present in the powder bed 52.

It is similarly possible, by controlling the first and second material supplies 46, 49 in terms of time and/or location, to produce material gradients in the lateral plane (perpendicular to the building-up direction 25) or in the building-up direction 25. For example, the matrix material of the component to be produced is supplied by the first material supply 46. The second material supply 49 may supply fibers, second phases or other constituents in different concentrations in terms of location, in order to create the gradient.

The material supplies 46, 49 may be moved in the lateral plane and in the building-up direction 25, so that a different material composition can occur in an inner region and an outer region, in that for example the first material supply 46 supplies a material of a superalloy in the inner region 31 (FIG. 4) and the second material supply 49 supplies for example the same material enriched for example with aluminum, chromium or MCrAlY (FIG. 4), in the outer region 28.

A gradient in the composition may be present in the building-up direction 25 and in the plane perpendicular thereto.

For example, a turbine blade may have a different composition on its convex side than on the concave side. This kind of gradient cannot be realized by a casting method.

Similarly, a material gradient can be created by a composition of the material supplied by means of the material supplies 46, 49 that is changed over time.

If the material supply 46, 49 is aligned with respect to the three-dimensional molded body to be produced in such a way that the material is to have a different composition there, the composition in the material supplies 46, 49 is changed at the corresponding point in time. This can be repeated from time to time.

The statements made with respect to the production of gradients or second phases in the molded body apply to the various methods which are described in this application (FIGS. 2, 6 and 7).

FIG. 7 shows a further apparatus 1 for carrying out a method according to the invention.

A three-dimensional molded body can also be produced without powder compacts 7, 10, powder beds 52. The partial quantities 7, 10 are supplied in the form of powder by means of the first and/or second material supply 46, 49 on the starting plate 4 only at the locations where they are required by the geometry of the three-dimensional molded body to be produced. The material supplied is bonded together and compacted, for example by means of electron beams or laser beams 13, by being exposed to a focal spot 43 of the laser.

The material supplies 46, 49 and the laser 16 or its laser beams 13 may be guided in three-dimensional space in a way corresponding to the desired geometry of the molded body.

The invention claimed is:

1. A method of producing without the use of a mould a complete three-dimensional body having an inner cavity, the method comprising:

disposing a first partial quantity of a compacted starting material, the first partial quantity having a shape different from a desired shape of the three-dimensional body;

exposing the first partial quantity to a controlled pattern of energy effective to melt only a portion of the first partial quantity;

directionally solidifying the melted portion of the first partial quantity to epitaxially grow a crystalline structure comprising a shape with outer and inner dimensions in accordance with a first layer of the desired shape of the three-dimensional body; and repeating the disposing and exposing steps with additional partial quantities of starting material to add additional layers of the desired shape to the first layer until the three-dimensional body of the desired shape having an inner cavity is formed.

2. The method of claim 1, further comprising varying, within a selected one of the partial quantities, a material composition of the starting material to achieve a composition gradient within a selected layer of the three-dimensional body.

3. The method of claim 2, further comprising disposing a nickel-based or cobalt-based superalloy powder to form an inner region of the selected one of the partial quantities, and disposing an MCrAlY alloy powder to form an outer region of the selected one of the partial quantities.

4. The method of claim 2 as applied to form a turbine blade and further comprising varying the material composition of the selected partial quantity between a first side and a second side so that the formed layer has a composition gradient between a convex side and a concave side of the turbine blade.

5. The method of claim 1, further comprising varying, between two different partial quantities, a material composition of the starting material to achieve a composition gradient between selected layers of the three-dimensional body.

6. The method of claim 5, further comprising disposing a starting material comprising reinforcing fibres for a first selected partial quantity and disposing a starting material without reinforcing fibres for a second selected partial quantity so that a first of the respective formed layers comprises the reinforcing fibres and a second of the respective formed layers lacks any reinforcing fibres.

* * * * *